United States Patent
Grynkewich et al.

(10) Patent No.: US 6,890,770 B2
(45) Date of Patent: May 10, 2005

(54) MAGNETORESISTIVE RANDOM ACCESS MEMORY DEVICE STRUCTURES AND METHODS FOR FABRICATING THE SAME

(75) Inventors: Gregory W. Grynkewich, Gilbert, AZ (US); Mark Deherrera, Tempe, AZ (US); Mark A. Durlam, Chandler, AZ (US); Clarence J. Tracy, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/885,869

(22) Filed: Jul. 6, 2004

(65) Prior Publication Data

US 2004/0257902 A1 Dec. 23, 2004

Related U.S. Application Data

(62) Division of application No. 10/417,851, filed on Apr. 16, 2003, now Pat. No. 6,784,510.

(51) Int. Cl.[7] .............................................. H01L 21/00
(52) U.S. Cl. ........................................ 438/3; 257/423
(58) Field of Search ............................................. 438/3

(56) References Cited

U.S. PATENT DOCUMENTS

| | | | |
|---|---|---|---|
| 6,587,371 B1 | * | 7/2003 | Hidaka ........................ 365/173 |
| 6,649,953 B2 | * | 11/2003 | Cha ............................ 257/295 |
| 6,657,270 B2 | * | 12/2003 | Kim et al. .................... 257/423 |

* cited by examiner

Primary Examiner—Michael Tran
Assistant Examiner—Thao P. Le
(74) Attorney, Agent, or Firm—Ingrassia, Fisher & Lorenz, P.C.

(57) ABSTRACT

A method for fabricating an MRAM device structure includes providing a substrate on which is formed a first transistor and a second transistor. An operative memory element device is formed in electrical contact with the first transistor. At least a portion of a false memory element device is formed in electrical contact with the second transistor. A first dielectric layer is deposited overlying the at least a portion of a false memory element device and the operative memory element device. The first dielectric layer is etched to simultaneously form a first via to the at least a portion of a false memory element device and a second via to the operative memory element device. An electrically conductive interconnect layer is deposited so the electrically conductive interconnect layer extends from the at least a portion of a false memory element device to the operative memory element device.

18 Claims, 5 Drawing Sheets

US 6,890,770 B2

MAGNETORESISTIVE RANDOM ACCESS MEMORY DEVICE STRUCTURES AND METHODS FOR FABRICATING THE SAME

RELATED APPLICATIONS

This application is a divisional of application Ser. No. 10/417,851 filed Apr. 16, 2003 now U.S. Pat. No. 6,784,510.

FIELD OF THE INVENTION

The present invention generally relates to magnetoelectronic devices, and more particularly relates to methods for fabricating magnetoresistive random access memory device structures that utilize false magnetic tunnel junction memory element devices and structures for magnetoresistive random access memory devices that utilize false magnetic tunnel junction memory element devices.

BACKGROUND OF THE INVENTION

Magnetoelectronics devices, spin electronics devices and spintronics devices are synonymous terms for devices that use the effects predominantly caused by electron spin. Magnetoelectronics effects are used in numerous information devices, and provide non-volatile, reliable, radiation resistant, and high-density data storage and retrieval. Magnetoresistive random access memory (MRAM) devices are well-known magnetoelectronics information devices.

One class of MRAM devices is composed of a plurality of arrays of memory elements known as magnetic tunnel junction (MTJ) elements and a plurality of programming lines, typically known as the bit lines and the digit lines, each used to create part of the magnetic field for programming the MTJ elements. An MTJ element in an array generally is electrically coupled to a transistor, typically an N-channel field effect transistor (FET), through an interconnect stack. The interconnect stack is formed using standard CMOS processing that utilizes a number of via and metallization layers, the formation of which requires a number of masking and etching steps. The number of via and metallization layers may vary depending upon the specific devices associated with the memory that are fabricated on the same chip. Formation of the MTJ element coupled to the interconnect stack and formation of its connection to the MRAM device array also utilize a number of masking and etching steps. Each masking and etching step adds to the cost and time required to produce an MRAM device. Thus, even elimination of one such step can result in fabrication cost and time savings.

Accordingly, it is desirable to provide improved methods for fabricating MRAM devices. In addition, it is desirable to provide methods for fabricating MRAM devices that utilize a reduced number of processing steps. Moreover, it is desirable to provide MRAM devices that are fabricated from methods that use a reduced number of processing steps. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Turning now to the figures, FIGS. 1–6 illustrate a method in accordance with one exemplary embodiment of the present invention for fabricating an MRAM device structure, the method utilizing a false magnetic tunnel junction element device during fabrication to reduce processing steps.

Figure 1:
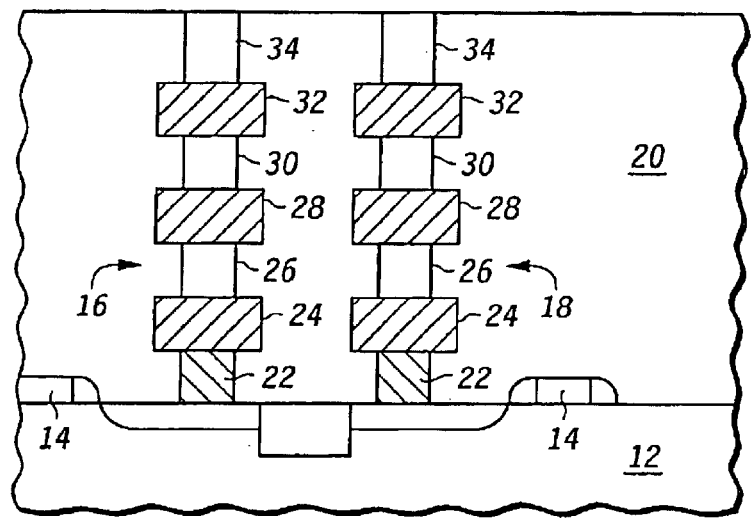
FIGS. 1–6 illustrate schematically, in cross section, a method for fabricating a magnetoresistive random access memory device structure in accordance with an exemplary embodiment of the present invention.

FIG. 1 is a cross-sectional view of a section 10 of a partially fabricated array of an MRAM device. The method begins by providing a semiconductor substrate 12, such as, for example, a silicon substrate, having a plurality of transistors 14, such as switching and/or isolation transistors. Other circuit elements, for example, an input/output circuit, a data/address decoder, and comparators, may be contained in the MRAM device; however, they are omitted from the drawings for simplicity.

In accordance with a standard and well known CMOS process, a first interconnect stack 16 and a second interconnect stack 18 of vias and metallization layers are formed in the line and stack formation overlying substrate 12, and typically within one or more dielectric materials 20, to provide the interconnections for the integrated circuit and the memory device array in which section 10 is included. As used herein, the term "layer" means one layer or a combination or plurality of sub-layers. Interconnect stacks 16 and 18 are formed by providing dielectric layers, masking and etching, and metal deposition all in a well-known manner. Also in accordance with the standard and well known process, the metal including the first vias on the source and drain terminals of transistors 14 are referred to as the contact layer 22 (CNT). The metallization layer forming the first layer of interconnects is referred to as the first metallization layer 24 (M1). Vias formed on layer M1 24 are referred to as the first via layer 26 (Via1), the next metallization layer is the second metallization layer 28 (M2), followed sequentially by a second via layer 30 (Via2), a third metallization layer 32 (M3), and as many, more or less, additional via layers and metallization layers as are needed to provide the desired interconnect for the specific apparatus and applications. While interconnect stacks 16 and 18 are shown with two via layers and three metallization layers, it will be understood that interconnect stacks 16 and 18 may have one or any suitable number of via layers and metallization layers. The last metallization layer of the interconnect stacks 16 and 18, to be discussed subsequently, caps a via layer 34 designated BVia.

Figure 2:
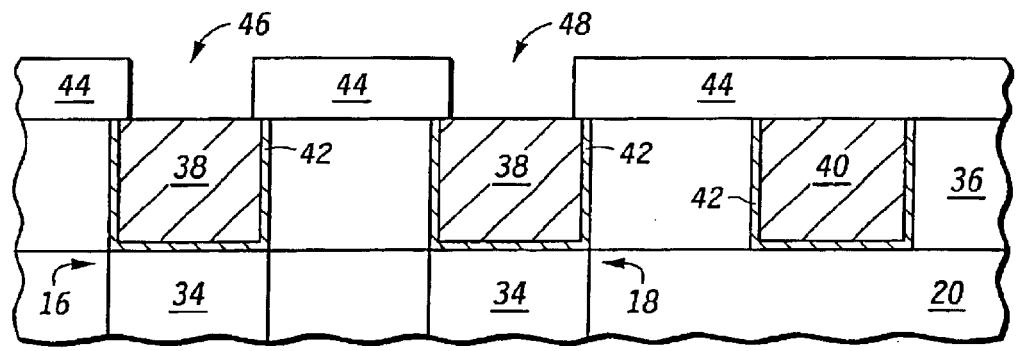

Referring to FIG. 2, another metallization layer 38, designated MDL, then may deposited using a damascene process. A dielectric material layer 36 is formed overlying section 10. Dielectric material layer 36 may comprise any suitable dielectric material such as, for example, silicon dioxide ($SiO_2$). Dielectric material layer 36 is suitably patterned and etched in accordance with standard and well known semiconductor processes. MDL 38 is deposited and excess metallization material is removed by any suitable technique, such as chemical mechanical polishing (CMP). MDL 38 includes a digit line 40 to be associated with a subsequently formed magnetic tunnel junction (MTJ) element, described in more detail below. Digit line 40 extends perpendicular to FIG. 2. MDL 38, and hence digit line 40, may comprise any suitable conductive material, such as aluminum (Al), aluminum alloys, copper (Cu) and copper alloys.

In a preferred embodiment of the invention, a cladding and/or barrier layer(s) 42 of material may be deposited prior to deposition of MDL 38. The cladding layer serves to focus the magnetic flux generated when a current is applied to digit line 40. The barrier layer(s) serve to improve adhesion of MDL 38 and to act as a barrier against diffusion of MDL 38 and the cladding layer material. In a more preferred embodiment of the invention, a barrier layer is first deposited, a cladding layer is subsequently deposited and then a second barrier layer is deposited before deposition of MDL 38. The barrier layer may comprise tantalum (Ta), tantalum nitride (TaN) or any other suitable materials. The cladding material may comprise a nickel-iron alloy or other similar material having high permeability.

In an alternative embodiment of the invention, it will be appreciated that, rather than using a damascene process, MDL 38 may be formed by using a subtractive process during which a metallization layer is deposited overlying section 10 and is then patterned and etched to form MDL 38, including digit line 40. Dielectric material layer 36 is deposited overlying dielectric material 20 and MDL 38 and is subsequently planarized, using any suitable technique, such as, for example, CMP.

After formation of MDL 38, a dielectric material layer 44 is formed overlying dielectric material layer 36, MDL 38, and digit line 40. Dielectric material layer 44 then is suitably patterned and etched using standard masking and etching techniques to form a first via, known as a top via 46 or T-Via, overlying first interconnect stack 16 and a second via, known as a memory via 48 or M-Via overlying second interconnect stack 18. In a preferred embodiment of the invention, T-Via 46 and M-Via 48 are etched simultaneously, although it will be appreciated that the vias could be etched during separate masking and etching processes.

Figure 3:
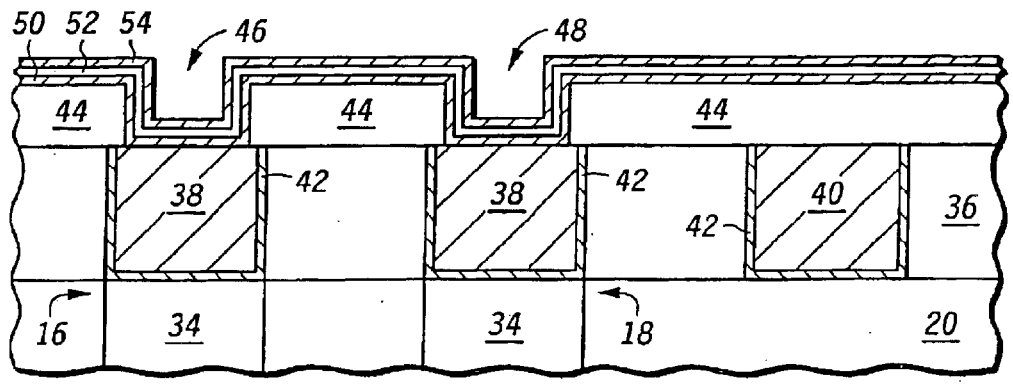

Referring now to FIG. 3, a first conductive layer 50, a memory element layer 52 and a second conductive layer 54 are deposited overlying dielectric material layer 44 and within T-Via 46 and M-Via 48. First conductive layer 50 comprises a non-magnetic conductor forming a lower electrical contact for an MTJ element to be subsequently formed and is deposited with a thickness of about 100 to about 4000 angstroms. First conductive layer 50 can be formed of any suitable electrically conductive materials. Preferably, first conductive layer 50 is formed of tantalum (Ta), tungsten (W), titanium (Ti), aluminum (Al), tantalum nitride (TaN) or combinations or alloys thereof. More preferably, first conductive layer 50 is formed of tantalum. Memory element layer 52 comprises materials that form the MTJ element, to be explained below. Particularly, memory element layer 52 comprises a first magnetic layer and a second magnetic layer that utilize magnetic material such as cobalt iron (CoFe) and nickel iron cobalt (NiFeCo). The first magnetic layer serves as a hard magnetic layer, magnetization in which is pinned or fixed, whereas magnetization directions in the second magnetic layer are free to be switched between two magnetic states. A tunnel barrier layer sandwiched between the first and second magnetic layers employs a non-conductive, non-magnetic material such as, for example, aluminum oxide ($AlO_x$, where $0 \leq x \leq 1.5$). The layers in the memory element layer 52 are thin with the magnetic layers varying from 5 to 400 angstroms and the tunnel barrier layer varying from 5 to 30 angstroms. Additional information as to the fabrication and operation of MTJ memory elements can be found in U.S. Pat. No. 5,734,605, entitled "Multi-Layer Magnetic Tunneling Junction Memory Cells," issued Mar. 31, 1998, and incorporated herein by reference. A second conductive layer 54 is deposited overlying memory element layer 52. Second conductive layer 54 typically has a thickness in the range of about 100 to about 4000 angstroms. Second conductive layer 54 can be formed of any suitable electrically conductive materials. Preferably, second conductive layer 54 is formed of tantalum, tungsten, titanium, aluminum, tantalum nitride or combinations or alloys thereof. More preferably second conductive layer 54 is formed of tantalum.

Figure 4:
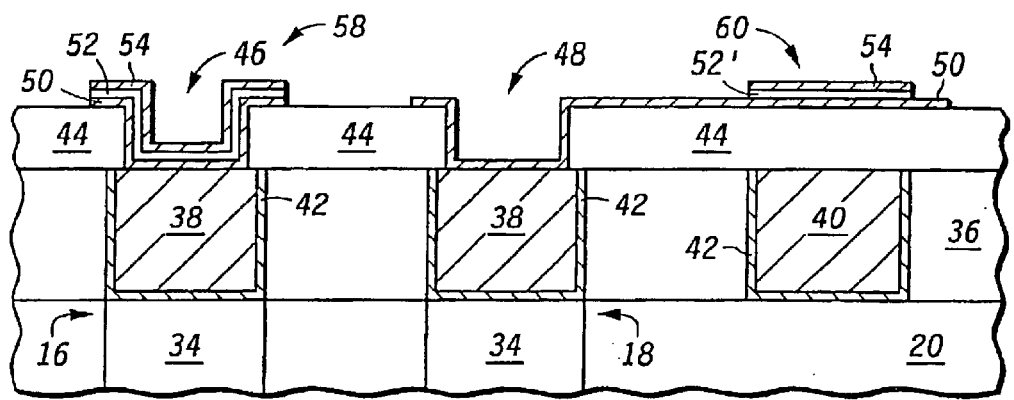

Layers 50, 52, and 54 are then patterned and etched using standard mask and etch techniques so that, as illustrated in FIG. 4, a "false" MTJ element device 58 is formed within T-Via 46 and electrically coupled to interconnect stack 16. The false MTJ element device 58, comprising first conductive layer 50, memory element layer 52, and second conductive layer 54, is isolated from a remainder of first conductive layer 50 that overlies M-Via 48 and that overlies other vias to other interconnect stacks (not shown). Accordingly, as used herein, the term "false" means that MTJ element device 58 overlying T-Via 46 is inoperative as an MTJ element device and serves as an electrical conductor. Further, because of the discontinuous topography of T-Via 46, the tunnel barrier layer of inoperative MTJ element 58 will be discontinuous and therefore electrically shorted.

Layers 52 and 54 are patterned and etched so that an operative MTJ element device 60 comprising contemporaneously-formed MTJ element 52' is formed on first conductive layer 50 and is disposed so as to be magnetically coupled to digit line 40. Layers 52 and 54 are etched from M-Via 48 and first conductive layer 50 is patterned and etched so as to electrically couple second interconnect stack 18 to operative MTJ element device 60 and to isolate operative MTJ element device 60 from other MTJ element devices (not shown).

Figure 5:
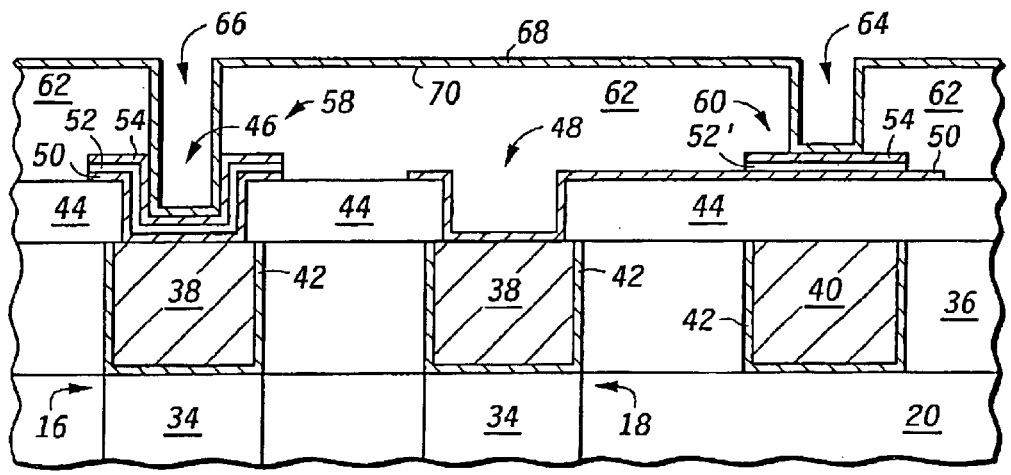

Referring to FIG. 5, a dielectric material layer 62 is deposited overlying false MTJ element device 58, operative MTJ element device 60 and M-Via 48. Then, dielectric material layer 62 is patterned and etched to define a hole 66 to first interconnect stack 16 and a hole 64 to operative MTJ element device 60. Typically, hole 66 is etched deeper from a surface 70 of dielectric material layer 62 than hole 64, as illustrated in FIG. 5. Accordingly, hole 64 and hole 66 may be formed using separate masking and etching steps. Alternatively, in a preferred embodiment of the present invention, hole 64 and hole 66 are etched simultaneously to eliminate a masking and etching step. Because of the difference in depth of hole 64 and hole 66, after hole 64 has been etched, second conductive layer 54 of operative MTJ element device 60 may be undesirably subjected to etching constituents while hole 66 is still being etched, potentially resulting in damage to operative MTJ element 52'. However, because of the presence of false MTJ element device 58, which is conductive and thus does not interfere with the operation of interconnect stack 16, hole 66 does not need to be etched to as great a depth as would be required if false MTJ element device 58 were not present. Accordingly, the time that second conductive layer 54 is subjected to etching constituents while hole 66 is etched is reduced.

After holes 64 and 66 have been etched, a conductive material is subsequently deposited to form a third conductive layer 68, known as the metal local interconnect (MLI). MLI 68 has a thickness typically in the range of about 100 to about 4000 angstroms. MLI 68 electrically couples first interconnect stack 16 to operative MTJ element device 60. It will be appreciated that the presence of false MTJ element device 58 decreases the aspect ratio of hole 66 thereby permitting a more uniform step coverage of hole 66 than would be realized without the presence of false MTJ element device 58.

Figure 6:
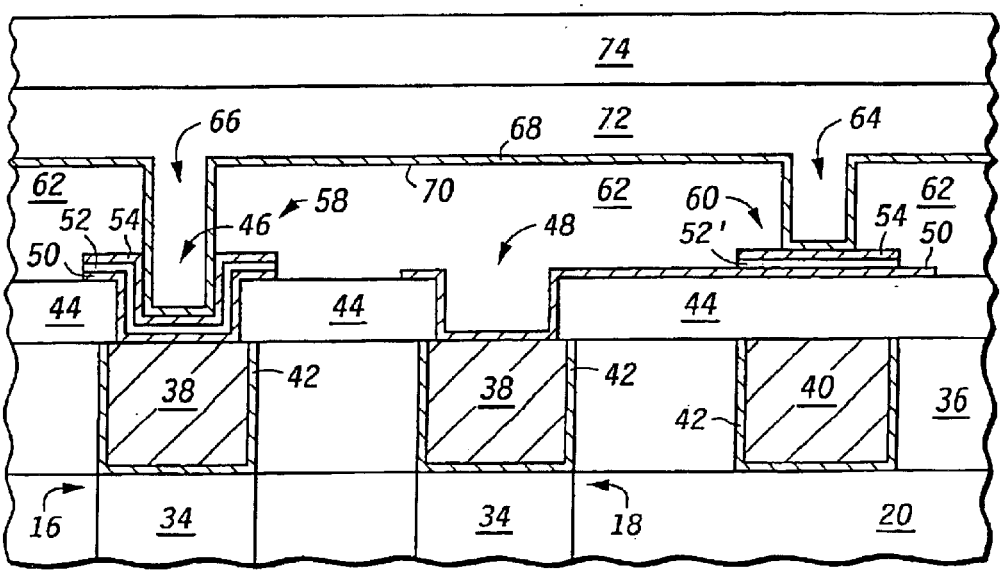

Referring to FIG. 6, a dielectric material layer 72 then is deposited overlying MLI 68 and within holes 64 and 66 and to a suitable thickness and is patterned and etched to form trenches for bit line 74. Bit line 74 is formed by depositing a metal such as, for example, aluminum (Al), tungsten (W) or copper (Cu) or an alloy thereof in the trench. In one embodiment of the invention, bit line 74 may be formed with a suitable cladding material (not shown) surrounding one or more sides of the bit line so as to focus the magnetic field from the bit line to operative MTJ element device 60.

Figure 7:
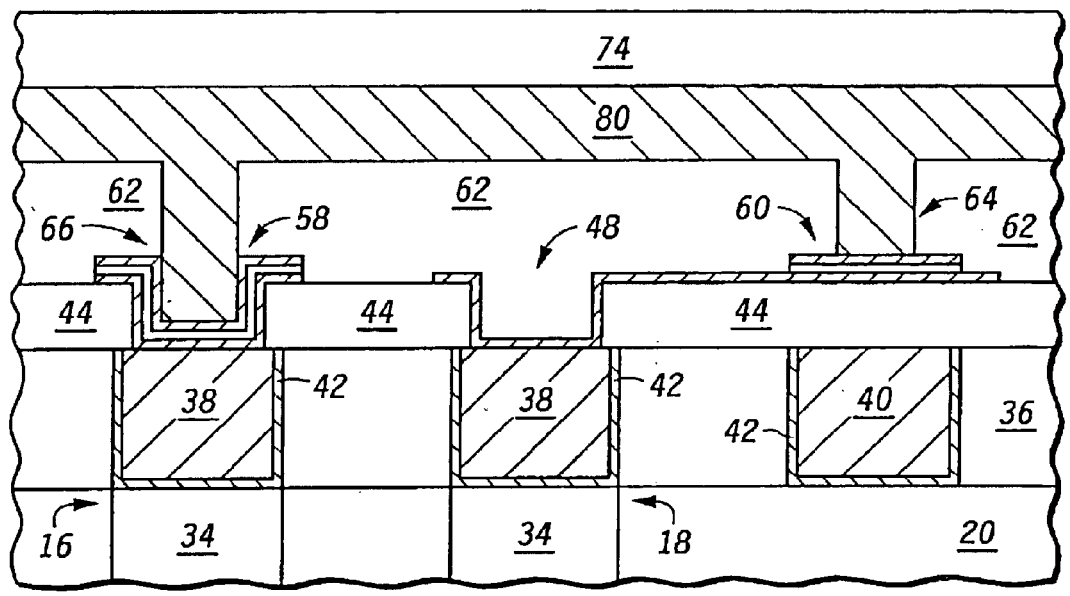
FIG. 7 illustrates schematically, in cross section, a magnetoresistive random access memory device structure in accordance with another exemplary embodiment of the present invention.

In another exemplary embodiment of the present invention, referring to FIG. 7, once holes 64 and 66 have been etched, a conductive material may be subsequently deposited to fill holes 64 and 66 and may be further deposited to a suitable thickness overlying insulating layer 62, typically in the range of about 1000 to about 8000 angstroms. This conductive material is then suitably patterned using known techniques. An insulating material (not shown) is then deposited and is patterned and etched to form trenches for bit line 74. Bit line 74 is then fabricated using the method as described above.

Figure 8:
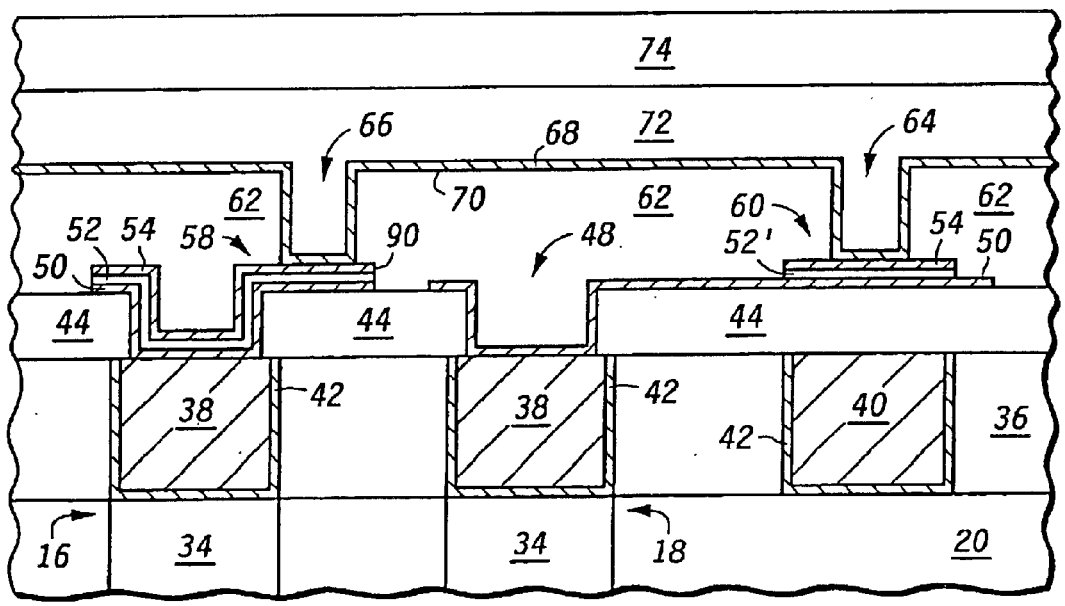
FIG. 8 illustrates schematically, in cross section, a magnetoresistive random access memory device structure in accordance with a further exemplary embodiment of the present invention.

Referring to FIG. 8, in a further exemplary embodiment of the present invention, false MTJ element device 58 can be fabricated with a landing 90, that is, a portion of layers 50, 52 and 54 which extend overlying insulating layer 44, so that hole 66 etched to false MTJ element device 58 can be etched to landing 90. As illustrated in FIG. 8, landing 90 is formed at the same time as operative MTJ element device 60 is formed and thus would be the same distance from surface 70 of insulating layer 62 as operative MTJ element device 60 is from surface 70 of insulating layer 62. Thus, hole 64 and hole 66 would take approximately the same amount of time to etch. Accordingly, the presence of false MTJ element, and particularly landing 90, significantly reduces the amount of time that is required to etch hole 66 and thus reduces the amount of time that second conductive layer 54 is subjected to etching constituents.

Figure 9:
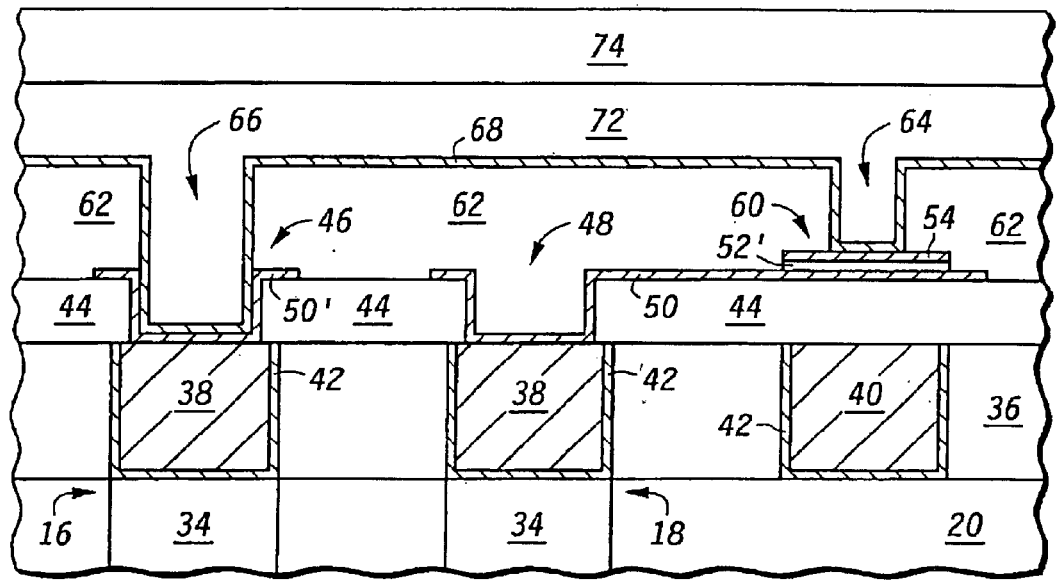
FIG. 9 illustrates schematically, in cross section, a magnetoresistive random access memory device structure in accordance with yet another exemplary embodiment of the present invention.
Figure 10:
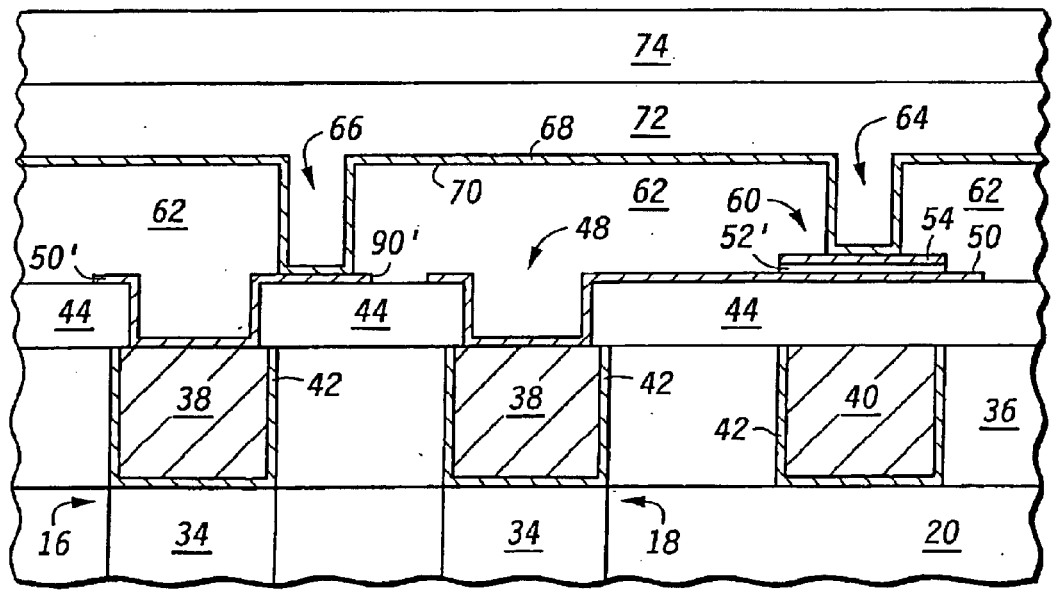
FIG. 10 illustrates schematically, in cross section, a magnetoresistive random access memory device structure in accordance with a further exemplary embodiment of the present invention.

In another exemplary embodiment of the present invention, the amount of time that second conductive layer 54 of operative MTJ element device 60 is subjected to etching constituents may be reduced if only a portion of a false MTJ element device is fabricated overlying T-Via 46. Referring to FIG. 9, after layers 50, 52 and 54 have been deposited overlying dielectric material layer 44, second conductive layer 54 and memory element layer 52 are patterned and etched so that operative MTJ element device 60 is formed on first conductive layer 50 and is disposed so as to be magnetically coupled to digit line 40. Layers 52 and 54 are etched from M-Via 48 and first conductive layer 50 is patterned and etched so as to electrically couple second interconnect stack 18 to operative MTJ element device 60 and to isolate operative MTJ element device 60 from other MTJ element devices (not shown). Layers 52 and 54 are also etched from first conductive layer 50 proximate to and within T-Via 46 to form first conductive layer 50'. First conductive layer 50' is suitably patterned and etched to electrically isolate it from the remainder of first conductive layer 50 that is electrically coupled to M-Via 48 and operative MTJ element device 60.

Dielectric material layer 62 then is deposited overlying first conductive layer 50', first conductive layer 50, and operative MTJ element device 60 and within T-Via 46 and M-Via 48. Then, dielectric material layer 62 is patterned and etched to define hole 66 to first interconnect stack 16 and hole 64 to operative MTJ element device 60. Again, while hole 64 and hole 66 may be formed using separate masking and etching steps, in a preferred embodiment of the present invention, hole 64 and hole 66 are etched simultaneously to eliminate a masking and etching step. Because of the presence of first conductive layer 50' at T-Via 46, hole 66 is not as deep as if first conductive layer 50' were not present. Accordingly, the time that second conductive layer 54 is subjected to etching constituents while hole 66 is etched is reduced.

In a further alternative embodiment of the present invention, first conductive layer 50' can be fabricated with a landing 90', that is, a portion of layer 50' that extends overlying insulating layer 44, so that hole 66 can be etched to landing 90'. Accordingly, the presence of first conductive layer 50', and particularly landing 90', significantly reduces the amount of time that is required to etch hole 66 and thus reduces the amount of time that second conductive layer 54 is subjected to etching constituents.

Figure 11:
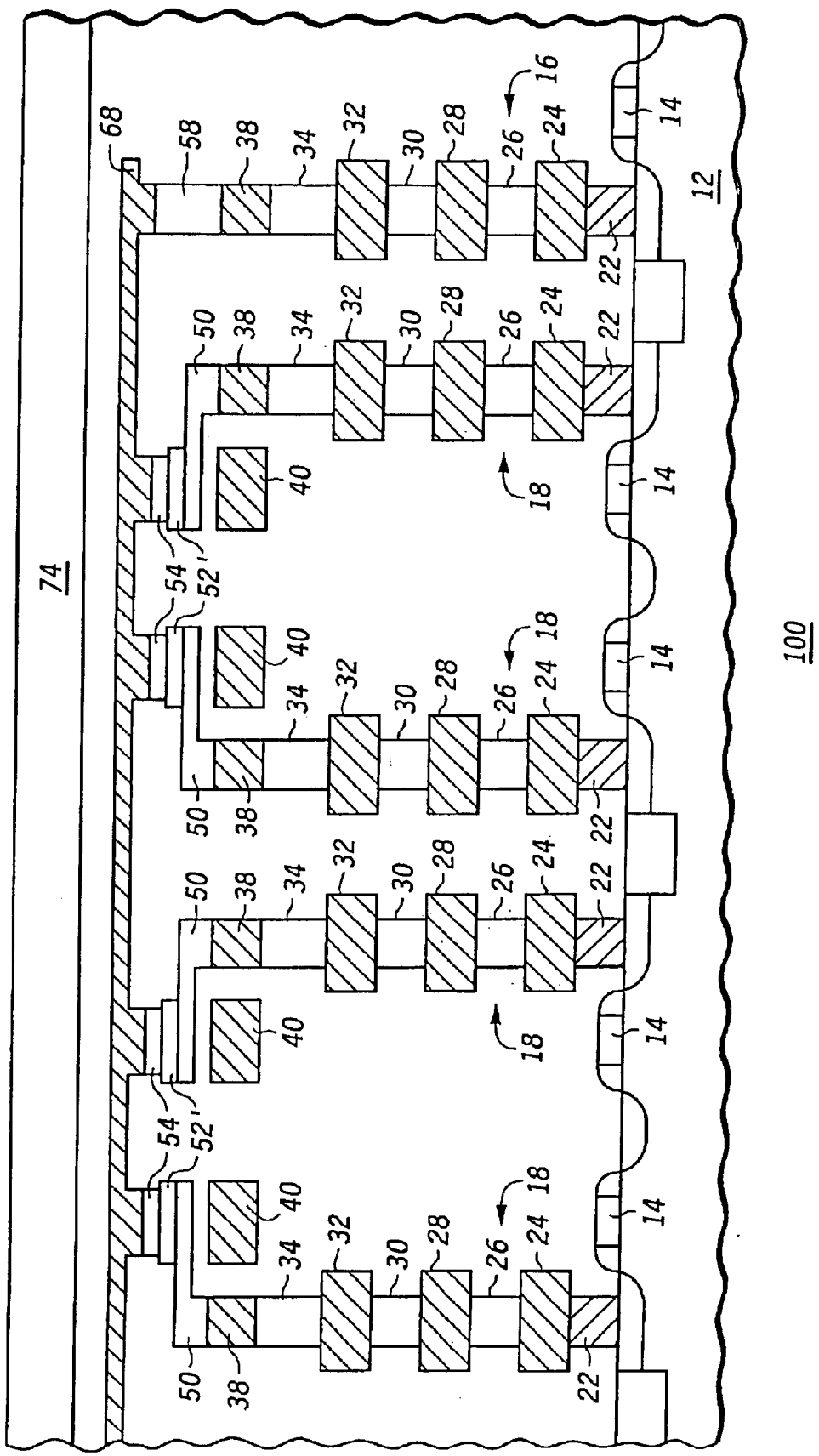
FIG. 11 illustrates schematically, in cross section, a portion of an array of a magnetoresistive random access memory device in accordance with another exemplary embodiment of the present invention.

FIG. 11 illustrates a simplified sectional view of a portion of a magnetic memory element array 100 of an MRAM device in accordance with an exemplary embodiment of the present invention. Elements of FIG. 11 that have the same reference numbers as FIGS. 1–6 are the same as the corresponding FIGS. 1–6 elements. While a portion of only one magnetic memory element array of an MRAM device is illustrated in FIG. 11 for convenience, it will be appreciated that the MRAM device may comprise any suitable number of such arrays.

Magnetic memory element array 100 comprises substrate 12 having a plurality of transistors 14. Each array 100 comprises a first interconnect stack 16 and a plurality of second interconnect stacks 18, which stacks 16 and 18 have via layers and metallization layers as explained above and are each electrically coupled to a source or drain of a transistor 14 of substrate 12. First interconnect stack 16 of each array 100 and the plurality of interconnect stacks 18 are fabricated with a metallization layer MDL 38. During fabrication of MDL 38, digit lines 40 are also fabricated. One digit line 40 is associated with each interconnect stack 18 of array 100.

A false MTJ element device 58 is electrically coupled to interconnect stack 16 and an MLI 68 is electrically coupled to false MTJ element device 58. An operative MTJ element 52' is electrically coupled to each interconnect stack 18 by a first conductive layer 50 and is electrically coupled to MLI 68 by a second conductive layer 54. A bit line 74, associated with a row (or column) of array 100 is connected through an interconnect stack (not shown) to one of the transistors 14 (not shown). While lines 40 and 74 are referred to as "digit lines" and "bit lines", respectively, for convenience, it will be appreciated that these titles could be reversed or changed in specific applications (e.g., program lines) and are not intended in any way to limit the invention.

Thus, a magnetoresistive random access memory device structure and a method for fabricating a magnetoresistive random access memory device structure that takes advantage of the presence of a false magnetic tunnel junction element device during masking and etching processes has been provided. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating a magnetoresistive random access memory device structure, the method comprising the steps of:
   providing a semiconductor substrate having a first transistor and second transistor formed therein;
   forming an operative magnetic tunnel junction element device in electrical contact with said first transistor;
   forming at least a portion of a false magnetic tunnel junction element device in electrical contact said second transistor;
   depositing a first dielectric layer overlying said at least a portion of a false magnetic tunnel junction element device and said operative magnetic tunnel junction element device;
   patterning and etching said first dielectric layer to simultaneously form a first via to said at least a portion of a false magnetic tunnel junction element device and a second via to said operative magnetic tunnel junction element device; and
   depositing an electrically conductive interconnect layer so that said electrically conductive interconnect layer extends from said at least a portion of a false magnetic tunnel junction element device to said operative magnetic tunnel junction element device.

2. The method of claim 1, said step of forming at least a portion of a false magnetic tunnel junction element device comprising forming a false magnetic tunnel junction element device having a first conductive layer, a magnetic tunnel junction element layer and a second conductive layer.

3. The method of claim 1, said step of forming at least a portion of a false magnetic tunnel junction element device comprising depositing a first conductive layer.

4. The method of claim 1, said step of patterning and etching comprising etching said first via to a landing of said at least a portion of a false magnetic tunnel junction element device.

5. The method of claim 1, further comprising forming a digit line that is magnetically coupled to said operative magnetic tunnel junction element device.

6. The method of claim 1, further comprising:
   providing a second dielectric layer overlying said electrically conductive interconnect layer;
   patterning and etching said second dielectric layer to form a trench; and
   forming a bit line within said trench.

7. The method of claim 1, said step of depositing an electrically conductive interconnect layer comprising depositing an electrically conductive layer having a thickness in the range of about 100 to about 4000 angstroms.

8. The method of claim 1, wherein during said step of patterning and etching, said first dielectric layer is etched so that said first via and said second via have approximately the same depth.

9. The method of claim 1, said step of forming an operative magnetic tunnel junction element device comprising forming an operative magnetic tunnel junction element device having a first conductive layer, a magnetic tunnel junction element and a second conductive layer.

10. A method for fabricating a magnetoresistive random access memory device structure overlying a substrate comprising a first transistor and a second transistor, the method comprising the steps of:
    depositing a first conductive layer electrically coupled to the first transistor and the second transistor, said first conductive layer having a first portion and a second portion;
    depositing a memory element layer overlying said first portion of said first conductive layer;
    depositing a second conductive layer overlying said memory element layer to form an operative magnetic tunnel junction element device that is electrically coupled to the first transistor;
    electrically isolating said second portion of said first conducting layer from said first portion to form at least a portion of a false magnetic tunnel junction element device that is electrically coupled to the second transistor;
    forming an insulating layer overlying said at least a portion of a false magnetic tunnel junction element device and said operative magnetic tunnel junction element device;
    simultaneously etching a first via through said insulating layer to said at least a portion of a false magnetic tunnel junction element device and a second via through said insulating layer to said operative magnetic tunnel junction element device; and
    depositing a third conductive layer that electrically couples said second transistor to said operative magnetic tunnel junction element device.

11. The method of claim 10, said step of depositing a memory element layer overlying said first portion of said first conductive layer comprising the step of depositing said memory element layer overlying said second portion of said first conductive layer.

12. The method of claim 11, said step of electrically isolating said second portion of said first conductive layer from said first portion comprising the step of electrically isolating said second conductive layer and said memory element layer overlying said second portion of said first conductive layer from said second conductive layer and said memory element layer overlying said first portion of said first conductive layer to form a false magnetic tunnel junction element device that is electrically coupled to the second transistor.

13. The method of claim 10, further comprising the step of forming a digit line overlying the substrate before the step of depositing a first conductive layer.

14. The method of claim 13, the step of depositing a second conductive layer comprising the step of depositing a second conductive layer overlying said memory element layer to form said operative magnetic tunnel junction element device that is magnetically coupled to said digit line.

15. The method of claim 10, further comprising said step of forming a bit line that is magnetically coupled to said operative magnetic tunnel junction element device.

16. The method of claim 10, said step of simultaneously etching a first via and a second via comprising the step of simultaneously etching said first via and said second via so that said first via and said second via have approximately the same depth.

17. The method of claim 10, said step of simultaneously etching a first via and a second via comprising the step of simultaneously etching said first via to a landing of said at least a portion of said false magnetic tunnel junction element device.

18. The method of claim 17, said step of simultaneously etching a first via and a second via further comprising the step of simultaneously etching said first via and said second via so that said first via and said second via have approximately the same depth.

* * * * *